(12) United States Patent
Hano

(10) Patent No.: US 8,284,533 B2
(45) Date of Patent: Oct. 9, 2012

(54) SEMICONDUCTOR DEVICE INCLUDING A BOOTSTRAP DIODE, HIGH SIDE POWER DRIVE CIRCUIT, LOW SIDE POWER DRIVE CIRCUIT, AND CONTROL CIRCUIT FOR CONTROLLING A HIGH SIDE POWER DEVICE AND LOW SIDE POWER DEVICE

(75) Inventor: Mitsutaka Hano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 25 days.

(21) Appl. No.: 12/886,980

(22) Filed: Sep. 21, 2010

(65) Prior Publication Data

US 2011/0199710 A1 Aug. 18, 2011

(30) Foreign Application Priority Data

Feb. 16, 2010 (JP) ................................. 2010-031166

(51) Int. Cl.
*H02H 3/24* (2006.01)
*H02H 3/20* (2006.01)
(52) U.S. Cl. ............................................ 361/92; 361/90
(58) Field of Classification Search ....................... 361/92
See application file for complete search history.

(56) References Cited

U.S. PATENT DOCUMENTS

| 5,969,964 | A  | * | 10/1999 | Mangtani ........................ 363/132 |
| 6,008,593 | A  | * | 12/1999 | Ribarich ......................... 315/307 |
| 6,825,700 | B2 | * | 11/2004 | Hano ............................... 327/108 |
| 6,859,087 | B2 | * | 2/2005  | Galli et al. ..................... 327/423 |
| 6,891,339 | B2 | * | 5/2005  | Ribarich et al. ............... 315/291 |
| 7,414,372 | B2 | * | 8/2008  | Ribarich ......................... 315/307 |
| 7,436,127 | B2 | * | 10/2008 | Ribarich et al. ............... 315/291 |
| 7,948,204 | B2 | * | 5/2011  | Palma et al. ................... 318/798 |
| 2004/0120090 | A1 | | 6/2004 | Galli et al. |
| 2010/0123442 | A1 | * | 5/2010 | Peterson et al. .............. 323/282 |

FOREIGN PATENT DOCUMENTS

| DE | 103 51 033 A1 | 6/2004 |
| JP | 5-283718 | 10/1993 |
| JP | 8-103087 | 4/1996 |
| JP | 10-321878 | 12/1998 |
| JP | 11-27931 | 1/1999 |
| JP | 2002-136150 | 5/2002 |
| JP | 2006-270034 | 10/2006 |
| JP | 2006-314154 | 11/2006 |

OTHER PUBLICATIONS

Office Action issued Jul. 5, 2012 in German Patent Application No. 10 2010 064 410.2, with English translation.

* cited by examiner

*Primary Examiner* — Dharti Patel
(74) *Attorney, Agent, or Firm* — Oblon, Spivak, McClelland, Maier & Neustadt, L.L.P.

(57) ABSTRACT

A semiconductor device includes, a high side drive circuit for controlling the high side power device and including a circuit load, a low side drive circuit for controlling the low side power device, a VCC terminal connected to the low side drive circuit and for supplying a VCC potential to the low side drive circuit, the VCC potential serving as a power supply potential to the low side drive circuit, a bootstrap diode connected at its anode to the VCC terminal and at its cathode to the high side drive circuit and used to produce a VB potential serving as a power supply potential to the high side drive circuit, and means for turning off the circuit load before the VB potential becomes lower than the VCC potential.

8 Claims, 8 Drawing Sheets

SEMICONDUCTOR DEVICE INCLUDING A BOOTSTRAP DIODE, HIGH SIDE POWER DRIVE CIRCUIT, LOW SIDE POWER DRIVE CIRCUIT, AND CONTROL CIRCUIT FOR CONTROLLING A HIGH SIDE POWER DEVICE AND LOW SIDE POWER DEVICE

BACKGROUND OF THE INVENTION

1. Field of the Invention

The present invention relates to a semiconductor device using a bootstrap circuit system to drive the power devices of an inverter, etc.

2. Background Art

A semiconductor device for driving power devices will be described with reference to FIG. 7. The semiconductor device 100 shown in FIG. 7 is adapted to control a high side power device 130 and a low side power device 134 which are connected in a totem-pole configuration. The semiconductor device 100 includes a high side drive circuit 102 for controlling the high side power device 130 and a low side drive circuit 114 for controlling the low side power device 134. Further, the semiconductor device 100 also includes a monolithically formed bootstrap diode 118.

The semiconductor device 100 is a high voltage IC and incorporates a "BSDi system" using the bootstrap diode 118. The bootstrap diode 118 is connected at its anode to a VCC terminal 138 and at its cathode to a VB terminal 140 for supplying a high-side floating supply absolute voltage VB, as shown in FIG. 7. A capacitor 122 is connected between the VB terminal 140 and a VS terminal 142 for supplying a high-side floating supply offset voltage VS. The capacitor 122 is charged through the bootstrap diode 118 when the low side power device 134 is turned on. Thus, this construction eliminates the need for a high side floating power supply.

FIG. 8 is a cross-sectional view of the bootstrap diode 118. Referring to FIG. 8, a P-well 210 is spaced from a P-type diffusion layer 204 so that the high voltage diode can be used as a bootstrap diode (BSDi). However, when a power supply voltage is applied to the semiconductor device 100 (which includes the bootstrap diode 118), the anode 200 of the bootstrap diode 118 is at a higher potential than the cathode 202 of the bootstrap diode 118 by an amount equal to the power supply voltage. The resulting voltage between the anode 200 and a p-substrate 208 causes a parasitic transistor PNPTr to conduct a current from the anode to the substrate, resulting in a significant increase in the current supplied from the VCC terminal 138 (i.e., the semiconductor device 100 consumes a considerable amount of current). More specifically, referring to FIG. 7, most of the current from the VCC terminal 138 flows through the anode of the bootstrap diode 118 to the p-substrate (i.e., the GND side), instead of flowing through the bootstrap diode 118 to charge the capacitor 122, and hence goes to waste.

Thus, the above construction of the semiconductor device 100 does not allow for reduction of the energy consumption of the device, although this construction eliminates the need for a high-side floating power supply by including a bootstrap diode. In order to address this problem, a device structure has been proposed in Japanese Laid-Open Patent Publication No. 5-283718 (1993) to reduce the parasitic current flowing through the parasitic transistor PNPTr. The bootstrap diode disclosed in this publication is formed so that a larger current flows through the lateral PNP transistor than through the vertical parasitic transistor PNPTr (the lateral PNP transistor having a higher current gain than the vertical transistor PNPTr), thereby reducing the parasitic current flowing in the vertical transistor PNPTr.

In this bootstrap diode, however, the $P^+$-layer for reducing the parasitic current must be formed near the $N^+$-layer of the cathode electrode. The formation of this $P^+$-layer is accomplished, e.g., by a double diffusion method. In common CMOS processes, however, the formation of a double diffusion layer is an optional process step. This means that a process including the formation of a double diffusion layer causes a high manufacturing cost. Further, a double diffusion layer forming step complicates the entire manufacturing process and hence increases the manufacturing cost, especially when the double diffusion layer is monolithically formed in the high side drive circuit so that the layer can be used as a bootstrap diode for supplying power to the high side drive circuit.

Further, the construction of the bootstrap diode disclosed in the above patent publication can reduce the parasitic current but cannot eliminate it, failing to sufficiently reduce the energy consumption of the device.

SUMMARY OF THE INVENTION

The present invention has been made to solve the above problems. It is, therefore, an object of the present invention to provide a semiconductor device constructed to reduce the parasitic current flowing through the parasitic transistor PNPTr in a bootstrap diode monolithically formed in the device without using a special manufacturing process.

According to one aspect of the present invention, a semiconductor device for controlling the drive of a high side power device and of a low side power device which are connected in a totem-pole configuration, the semiconductor device includes, a high side drive circuit for controlling the high side power device and including a circuit load, a low side drive circuit for controlling the low side power device, a VCC terminal connected to the low side drive circuit and for supplying a VCC potential to the low side drive circuit, the VCC potential serving as a power supply potential to the low side drive circuit, a bootstrap diode connected at its anode to the VCC terminal and at its cathode to the high side drive circuit and used to produce a VB potential serving as a power supply potential to the high side drive circuit, and means for turning off the circuit load before the VB potential becomes lower than the VCC potential.

Other and further objects, features and advantages of the invention will appear more fully from the following description.

DETAILED DESCRIPTION OF THE PREFERRED EMBODIMENT

Embodiment

Figure 1:
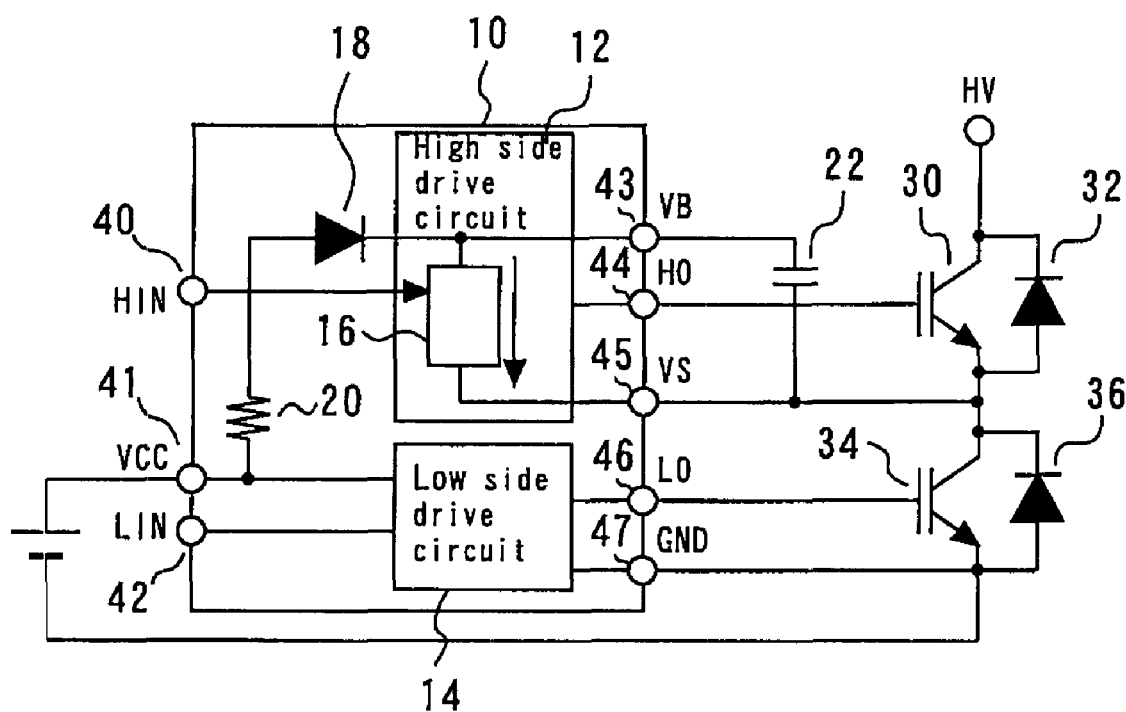
FIG. 1 is a diagram illustrating a semiconductor device of the embodiment.

An embodiment of the present invention will be described with reference to FIGS. 1 to 6. It should be noted that certain of the same or corresponding components are designated by the same reference numerals and described only once.

FIG. 1 is a diagram illustrating a semiconductor device of the embodiment. The semiconductor device 10 controls the drive of a high side power device 30 and of a low side power device 34 which are connected in a totem-pole configuration. The semiconductor device 10 includes a high side drive circuit 12 for controlling the high side power device 30. The high side drive circuit 12 includes a circuit load 16. The circuit load 16 functions as a steady-state (or DC) circuit current path through the high side drive circuit 12. In the present embodiment, the circuit load 16 is a high-side power supply under-voltage protection circuit (or UV circuit).

The semiconductor device 10 also includes a low side drive circuit 14 for controlling the low side power device 34. The power supply potential applied to the high side drive circuit 12 is supplied from a VB terminal 43. The power supply potential applied to the low side drive circuit 14, on the other hand, is supplied from a VCC terminal 41.

The semiconductor device 10 includes a bootstrap diode 18 connected at its anode to the VCC terminal 41 through a resistance 20 and at its cathode to the high side drive circuit 12. The bootstrap diode 18 is monolithically formed in the semiconductor device 10. The bootstrap diode 18 is used to produce a potential at the VB terminal 43.

The terminals of the semiconductor device 10 will now be described. The semiconductor device 10 has a high-side drive signal input terminal 40. The high-side drive signal input terminal 40 receives a signal for turning on and off the high side power device 30. The high-side drive signal input terminal 40 is connected to a high-side drive signal output terminal 44 through the circuit load 16. The high-side drive signal output terminal 44 is connected to the gate of the high side power device 30.

The semiconductor device 10 further includes a low-side drive signal input terminal 42. The low-side drive signal input terminal 42 receives a signal for turning on and off the low side power device 34. The low-side drive signal input terminal 42 is connected to a low-side drive signal output terminal 46 through the low side drive circuit 14. The low-side drive signal output terminal 46 is connected to the gate of the low side power device 34.

The semiconductor device 10 further includes a VS terminal connected to the junction between the high side power device 30 and the low side power device 34. The VS terminal is also connected to the VB terminal 43 through a capacitor 22.

Figure 2:
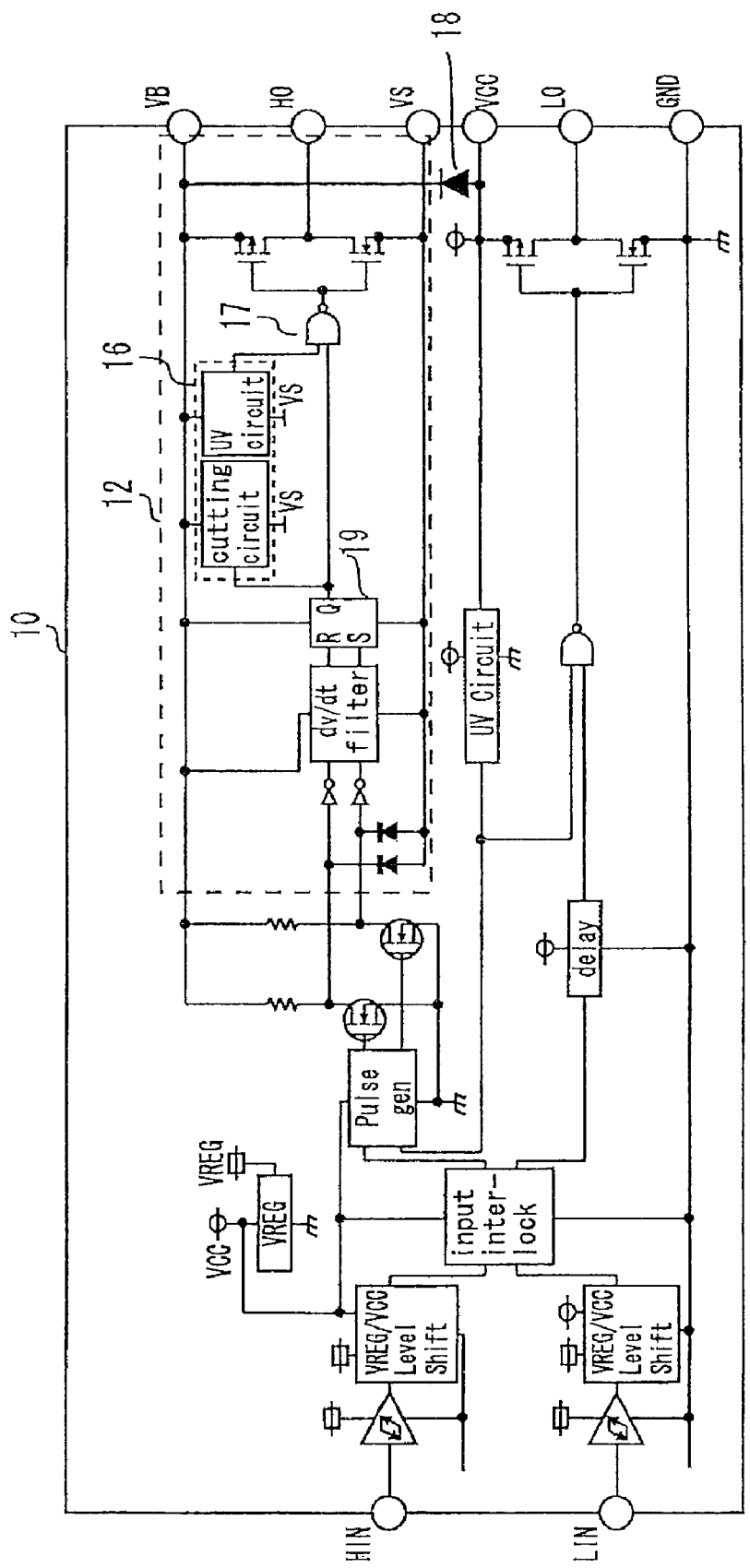
FIG. 2 is a diagram illustrating the details of the semiconductor device, which is only schematically shown in FIG. 1.

One of the features of the present embodiment is that the circuit load 16 can be turned off (i.e., set in its off state) by an external signal. Specifically, when a turn-off command (or signal) for turning off the high side power device is applied from the high-side drive signal input terminal 40 to the circuit load 16, the circuit load 16 is turned off. The circuit load 16 and circuitry connected to the circuit load 16 will be described in detail with reference to FIGS. 2 and 3. FIG. 2 is a diagram illustrating the details of the semiconductor device 10, which is only schematically shown in FIG. 1. As shown in FIG. 2, the high side drive circuit 12 includes an SR latch circuit 19. The SR latch circuit 19 is used to turn on and off the high side power device 30. The circuit load 16 is turned off when the Q signal, or output signal, of the SR latch circuit 19 is at an L level (or low logic level), which corresponds to a turn-off command for turning off the high side power device 30. When in its off state, the circuit load 16 is adapted to output an L level signal. This is accomplished by pulling down the output of the circuit load 16 to an L level. On the other hand, when the Q signal of the SR latch circuit 19 is at an H level (or high logic level), which corresponds to a turn-on command for turning on the high side power device 30, a load current is caused to flow through the circuit load 16 and, as a result, the circuit load 16 is turned on. In the present embodiment, a NAND circuit 17 is connected to the output of the circuit load 16.

Figure 3:
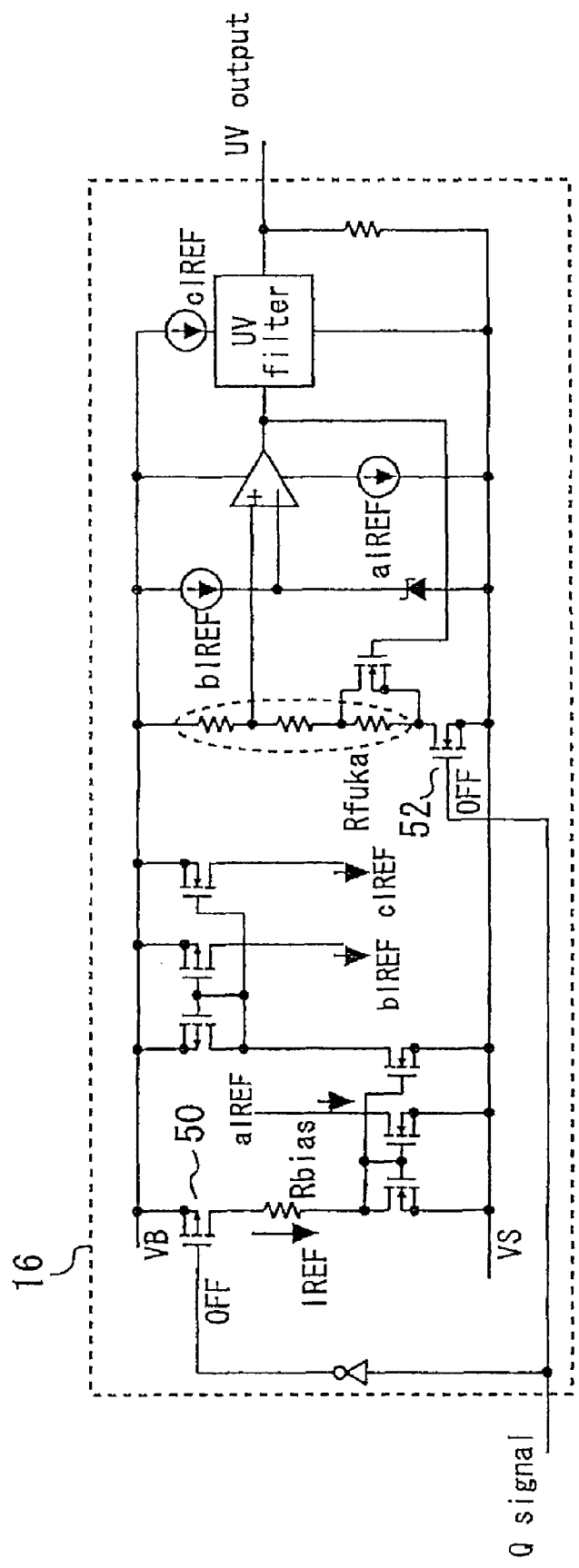
FIG. 3 shows the configuration of the circuit load of the embodiment.

FIG. 3 shows the configuration of the circuit load 16 of the present embodiment in detail. Upon detecting a drop in the power supply voltage between the VB and VS terminals, the circuit load 16, which is a UV circuit, outputs an L level signal as an error output to turn off the high side power device 30. The load current in the circuit load 16 includes the current flowing through the resistance load for detecting the power supply voltage (i.e., the series connection of resistances, Rfuka, connected between the VB and VS terminals) and the bias currents which flow through the bias current paths of the circuit load 16 and which are required for the operation of the comparator and filter circuits in the circuit load 16. These bias currents are a bias current aIREF for the UV comparator circuit, a bias current bIREF for the zener diode to generate a reference potential for the UV comparator, and a bias current cIREF for the filter circuit, as shown in FIG. 3. It should be noted that since the function of the circuit load 16 (or UV circuit) of the high side drive circuit 12 is to shut down the output of the high-side drive signal output terminal 44 (when necessary), there is no need for this function when the high side power device 30 is turned off.

Therefore, in the present embodiment, an n-MOSFET 52 is connected to the GND-side end of the resistance load Rfuka (enclosed by a dashed line in FIG. 3), and a p-MOSFET 50 is connected to the VB terminal-side end of the bias resistance Rbias, as shown in FIG. 3. The circuit load 16 is configured so that when the Q signal (described above) is at an L level, the n-MOSFET 52 and the p-MOSFET 50 are turned off. This cuts off the DC current paths for the bias currents aIREF, bIREF, and cIREF, as well as cutting off the DC current flowing through the series connection of resistances, Rfuka, for voltage detection. This ensures that no steady-state (or DC) current flows through the circuit load 16 when the high side power device 30 is off.

Thus, the present embodiment is characterized in that the circuit load 16 is turned off by a turn-off command for turning off the high side power device 30. It will be noted that the parasitic transistor PNPTr conducts a current when the VB potential (i.e., the potential on the VB terminal) is equal to or less than the VCC potential (i.e., the potential on the VCC terminal). In such cases, in conventional constructions, a circuit current flows between the VB terminal and VS terminal through the circuit load 16, resulting in unwanted energy consumption.

In the present embodiment, on the other hand, the circuit load 16 can be turned off so that no circuit current flows between the VB terminal 43 and the VS terminal 45. This prevents a steady-state base current from flowing through the parasitic transistor PNPTr in the bootstrap diode 18, thus preventing the transistor from conducting. This results in a decrease in the current consumption of the bootstrap diode 18. It should be noted that although a charge current transiently flows through the capacitor 22, the charging of the capacitor is completed in a short time. That is, no steady-state circuit current (DC component) flows after the capacitor 22 is fully charged. Thus, the present embodiment allows, without using a special manufacturing process, the reduction of the parasitic current flowing through the vertical parasitic transistor PNPTr in a bootstrap diode monolithically formed in a semiconductor device.

Power devices connected in a totem-pole configuration are generally connected to an inductive load such as a motor. During the dead time, during which both the high side power device and the low side power device are off, the inductive load acts to maintain the existing current flow, which is referred to as the "freewheel mode." As a result, a current continues to flow through the freewheel diode connected in reverse polarity in parallel with the low side power device immediately after the hide side power device is switched from its on state to its off state. At that time, the VS potential (i.e., the potential on the VS terminal) is equal to the GND potential plus the forward voltage Vf of the bootstrap diode, that is, it is substantially zero. The VB potential is equal to the VS potential plus the voltage across the capacitor (<VCC). As a result, a circuit current flows from the VB terminal to the VS terminal so that a base current flows through the parasitic transistor PNPTr, resulting in increased power consumption of the device. In the present embodiment, on the other hand, the VB potential does not become lower than the VCC potential even during the dead time. That is, since the circuit load 16 is turned off by a turn-off command for turning off the high side power device 30, the parasitic PNPTr does not conduct even during the dead time, resulting in reduced energy consumption in the semiconductor device.

Further, the semiconductor device does include a double diffusion layer, resulting in reduced manufacturing cost. Further, the reduced energy consumption means that the semiconductor device has increased life.

Figure 4:
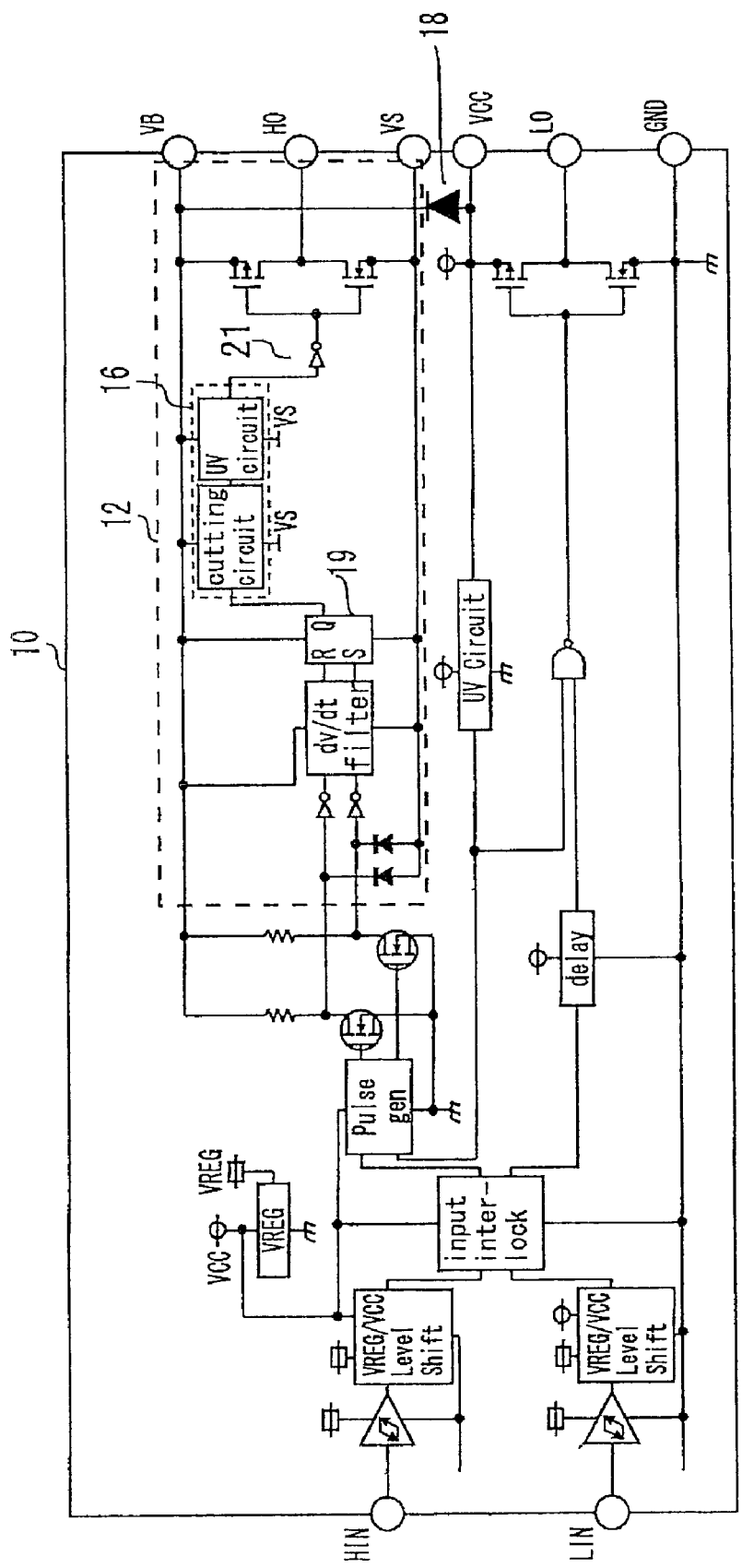
FIG. 4 shows another configuration of the circuit.
Figure 5:
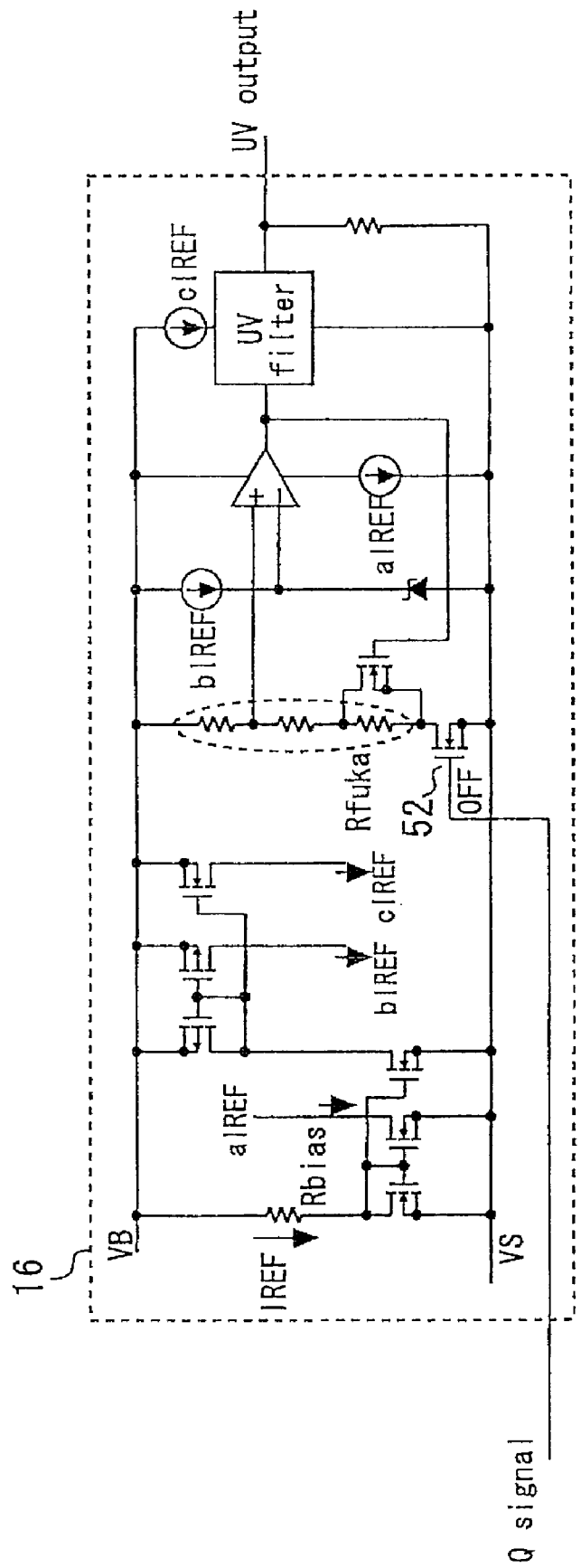
FIG. 5 shows another configuration of the circuit load.

Although in the present embodiment the circuit load 16 is connected to the circuit configuration shown in FIG. 2, it is to be understood that in other embodiments the circuit load 16 may be connected to a different circuit configuration. For example, the output of the UV circuit, which is turned on and off by the output of the SR latch circuit 19, may be inverted by a NOT gate, and the resulting signal may be output to drive the HO output buffer, as shown in FIG. 4. That is, the circuit shown in FIG. 4 differs from that shown in FIG. 2 in that the NAND circuit connected to the output of the UV circuit and to the output of the SR latch circuit is replaced by a NOT circuit 21 connected to the output of the UV circuit.

Although in the present embodiment the circuit load 16 has the configuration shown in FIG. 3, it is to be understood that the present invention is not limited to this particular configuration. For example, the circuit load 16 may have the configuration shown in FIG. 5 which differs from the configuration of FIG. 3 in that the p-MOSFET 50 is omitted (that is, only the n-MOSFET 52 is used to turn off the circuit load 16). Since the current (IREF) flowing through the bias resistance Rbias is used to operate the UV comparator circuit, cutting off this current may result in unstable operation of the UV circuit, that is, the output of the UV circuit may become unstable during the shut-down or start-up operation. The current IREF is typically approximately 10 microamperes, which is approximately one-tenth of the current constantly flowing through the resistance load Rfuka (typically 100 microamperes). Therefore, only the current flowing through the resistance load Rfuka may be cut off while allowing the constant flow of current IREF. This allows reduction of the steady-state (or DC) circuit current when the high side power device is off, as well as ensuring stable operation of the circuit load.

In the present embodiment, the circuit load 16 is turned off before the VB potential becomes lower than the VCC potential. This is accomplished by means of using the input to the high-side drive signal input terminal 40. However, the present invention is not limited to this method. Various means may be used to turn off the circuit load before the VB potential becomes lower than the VCC potential.

Figure 6:
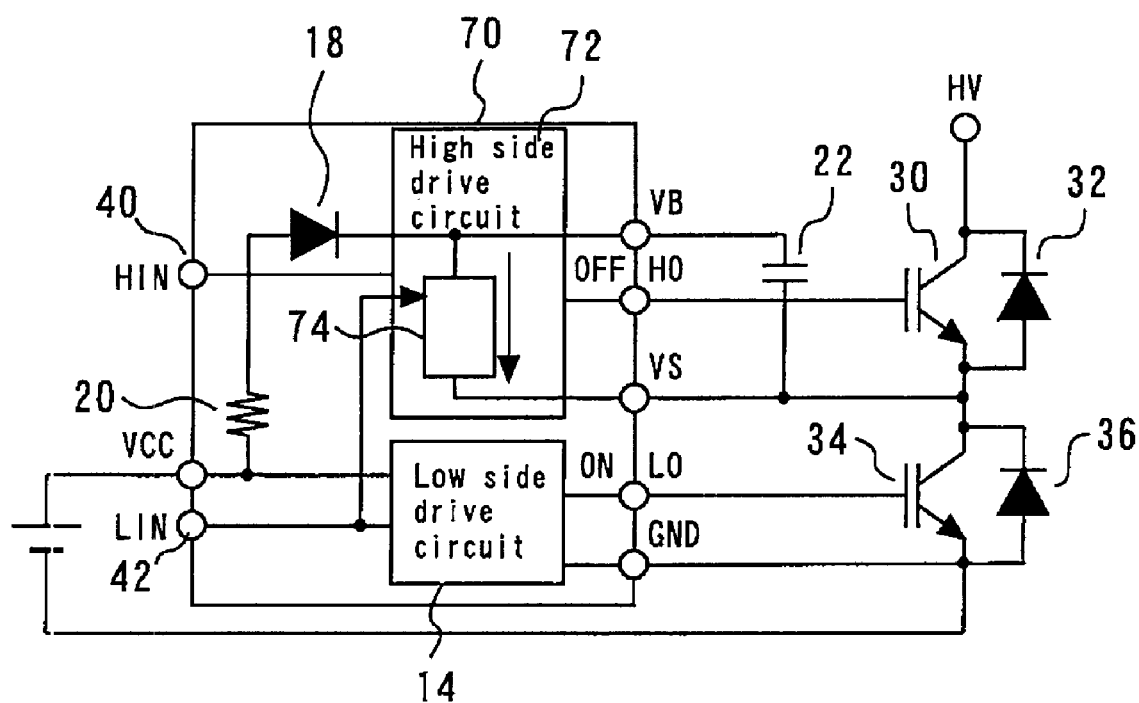
FIG. 6 shows the circuit controlled by the signal from the low-side power device.
Figure 7:
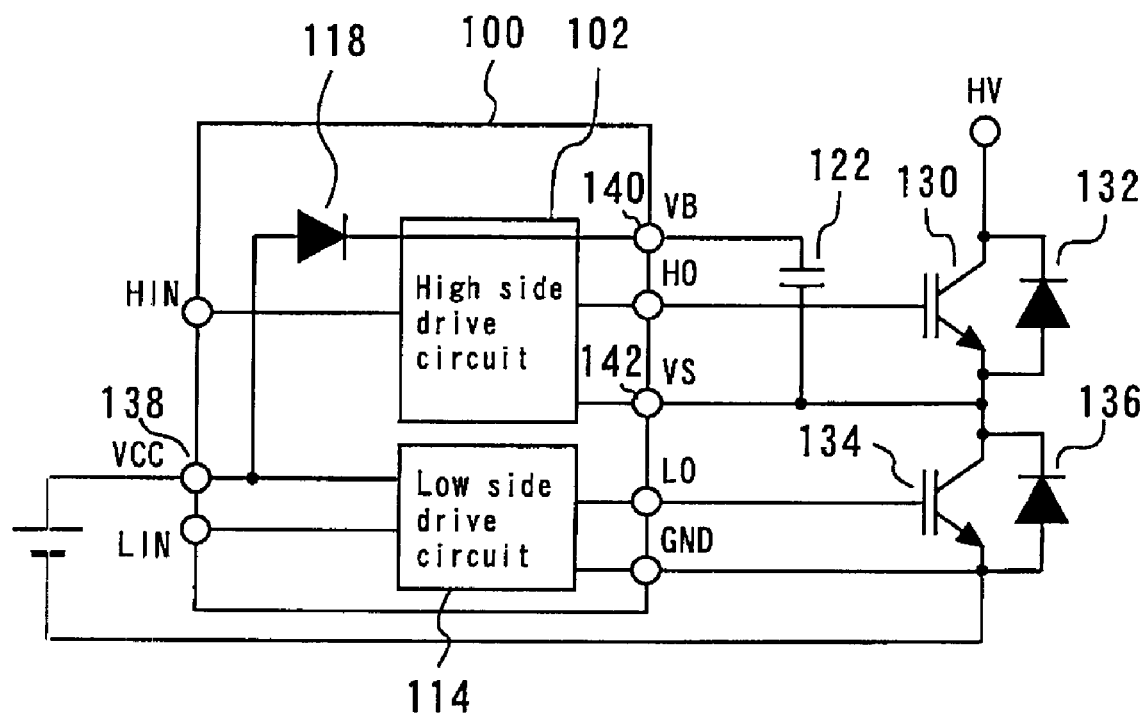
FIG. 7 shows a known semiconductor device.
Figure 8:
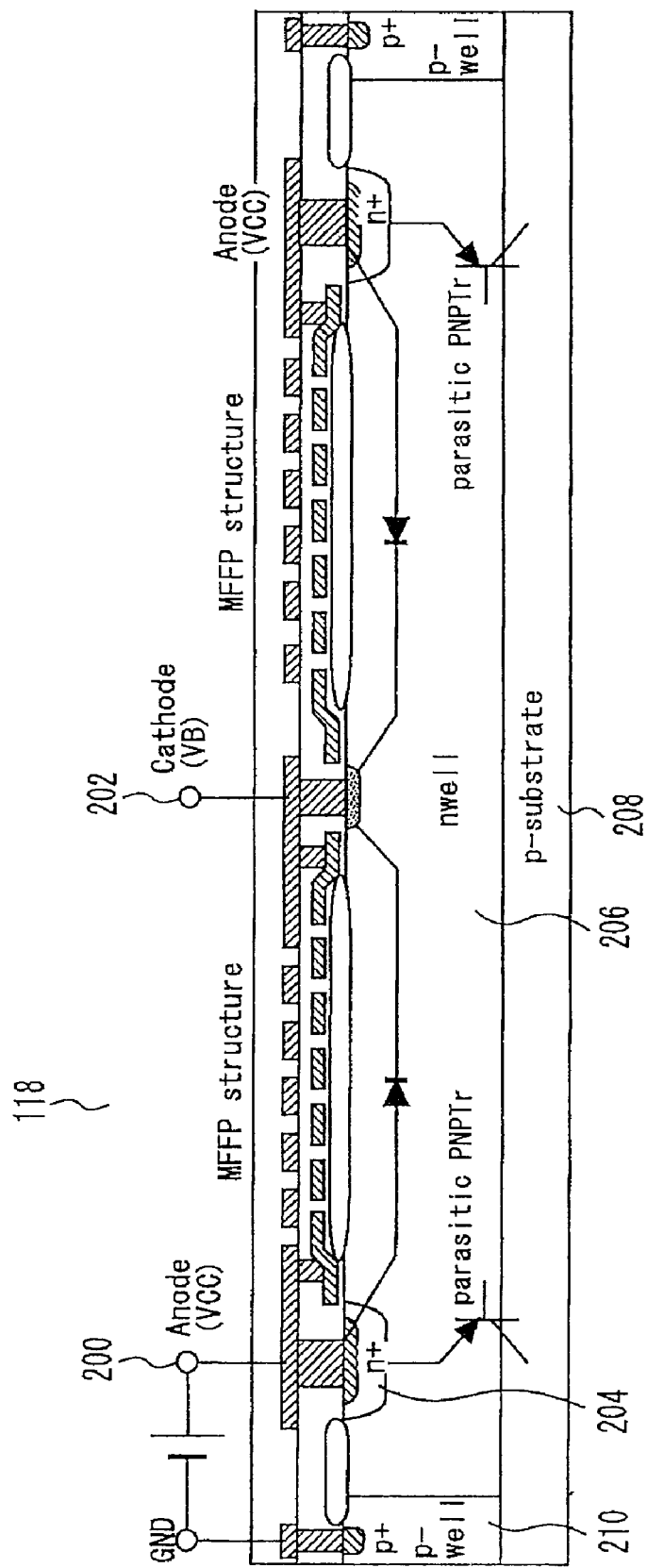
FIG. 8 is a cross-sectional view of the bootstrap diode.

For example, the semiconductor device 70 shown in FIG. 6 has the same advantages as described above in connection with the invention. In the semiconductor device 70 of FIG. 6, a low-side drive signal input terminal 42 is connected to a circuit load 74. Further, the semiconductor device 70 is configured so that the circuit load 74 is turned off when a turn-on command (or signal) for turning on the low side power device 34 is applied from the low-side drive signal input terminal 42 to the circuit load 74. This prevents a steady-state base current from flowing through the vertical parasitic transistor PNPTr, thus preventing the transistor from conducting. This results in reduced energy consumption. It should be noted that although a charge current transiently flows through the capacitor 22, the charging of the capacitor is completed in a short time. That is, no steady-state circuit current (DC component) flows after the capacitor 22 is fully charged.

It should be noted that when the circuit current in the high side drive circuit 72 is cut off (or the circuit load is turned off) by a signal from the low-side drive signal input terminal 42, this signal must be sent to the high side of the device. For that purpose, the semiconductor device may include a level shifting circuit. When a turn-on command (or signal) is applied to the low side power device 34, the off side of the level shifting circuit for the signal from the high-side drive signal input terminal 40 may be driven. Thus, the advantages of the present invention can be realized by any semiconductor device provided with means for turning off the circuit load before the VB potential becomes lower than the VCC potential.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-031166, filed on Feb. 16, 2010 including specification, claims, drawings and summary, on which the Convention priority of the present application is based, are incorporated herein by reference in its entirety.

What is claimed is:

1. A semiconductor device for controlling the drive of a high side power device and of a low side power device which are connected in a totem-pole configuration, said semiconductor device comprising:
    a high side drive circuit for controlling said high side power device and including a circuit load;
    a low side drive circuit for controlling said low side power device;
    a VCC terminal connected to said low side drive circuit and for supplying a VCC potential to said low side drive circuit, said VCC potential serving as a power supply potential to said low side drive circuit;
    a bootstrap diode connected at its anode to said VCC terminal and at its cathode to said high side drive circuit and used to produce a VB potential serving as a power supply potential to said high side drive circuit; and
    a control circuit for turning off said circuit load before said VB potential becomes lower than said VCC potential.

2. The semiconductor device according to claim 1, wherein said control circuit for turning off said circuit load turns off said circuit load by use of a turn-off command for turning off said high side power device.

3. The semiconductor device according to claim 1, wherein said circuit load is a high-side power supply undervoltage protection circuit.

4. The semiconductor device according to claim 3, wherein:
- said high-side power supply undervoltage protection circuit includes a series connection of resistances for voltage detection and further includes a bias current path; and
- said control circuit for turning off said circuit load is adapted to prevent a current from flowing through said series connection of resistances for voltage detection and said bias current path.

5. The semiconductor device according to claim 3, wherein:
- said high-side power supply undervoltage protection circuit includes a series connection of resistances for voltage detection; and
- said control circuit for turning off said circuit load is adapted to prevent a current from flowing through said series connection of resistances for voltage detection.

6. The semiconductor device according to claim 4, wherein said control circuit for turning off said circuit load is a switching device.

7. The semiconductor device according to claim 1, wherein said control circuit for turning off said circuit load turns off said circuit load by use of a turn-on command for turning on said low side power device.

8. A semiconductor device for controlling the drive of a high side power device and of a low side power device which are connected in a totem-pole configuration, said semiconductor device comprising:
- a high side drive circuit for controlling said high side power device and including a circuit load;
- a low side drive circuit for controlling said low side power device;
- a VCC terminal connected to said low side drive circuit and for supplying a VCC potential to said low side drive circuit, said VCC potential serving as a power supply potential to said low side drive circuit;
- a bootstrap diode connected at its anode to said VCC terminal and at its cathode to said high side drive circuit and used to produce a VB potential serving as a power supply potential to said high side drive circuit; and
- means for turning off said circuit load before said VB potential becomes lower than said VCC potential.

* * * * *